US000001399H

United States Statutory Invention Registration [19]

[11] Reg. Number: H1399

[43] Published: Jan. 3, 1995

Kozlowski et al.

[54] PROCESS FOR TRANSFORMING PURE $Y_2BACUO_5$ INTO A SUPERCONDUCTING MATRIX OF $YBA_2CU_3O_{7-x}$ WITH FINE AND HOMOGENEOUSLY DISPERSED $Y_2BACUO_5$ INCLUSIONS

[75] Inventors: Gregory Kozlowski, Centerville; William E. Endres, Bellbrook, both of Ohio

[73] Assignee: The United States of America as represented by the Secretary of the Air Force, Washington, D.C.

[21] Appl. No.: 86,583

[22] Filed: Jul. 6, 1993

[51] Int. Cl.[6] ..... H01L 39/12

[52] U.S. Cl. ..... 505/452; 505/742; 505/785

[58] Field of Search ..... 505/742, 785, 1

[56] References Cited

U.S. PATENT DOCUMENTS

| | | | |
|---|---|---|---|
| 4,929,595 | 5/1990 | Wu | 505/1 |
| 4,956,338 | 9/1990 | Rapp | 423/593 |
| 4,994,437 | 2/1991 | Torii et al. | 505/1 |
| 5,084,436 | 1/1992 | Morimoto et al. | 505/1 |
| 5,116,810 | 5/1992 | Joshi et al. | 505/1 |
| 5,116,812 | 5/1992 | Lelental et al. | 505/1 |
| 5,157,017 | 10/1992 | Jin et al. | 505/1 |
| 5,200,389 | 4/1993 | Tachikawa | 505/742 |
| 5,231,076 | 7/1993 | Jeong | 505/742 |
| 5,240,903 | 8/1993 | Shimoyama | 505/785 |
| 5,248,660 | 9/1993 | Lee | 505/742 |

OTHER PUBLICATIONS

McGinn "Microstructure and Critical Current Density of Zone Melt Tectured $YBa_2Cu_3O_{6+x}/Y_2BaCuO_5$ with $BaSuO_3$ Additions" *Appl. Phys. Lett.* v. 59(1) 1 Jul. 1991, pp. 120–123.

I. K. Jeong et al, "Infiltration-Reaction Process for Fabricating YBa2Cu3O7-δ Superconductor", Physica C, vols. 185–189 (1991) Part IV, pp. 2393–2394, Dec. 1991.

K. W. Lee et al. "Magnetization and Flux Creep in YBa2Cu3Ox Superconductor Prepared by Infiltration-Reaction Process", Physica C. vol. 185–189 (1991) Part IV, pp. 2263–2264, Dec. 1991.

D. Willen et al, "A Method to Control Grain-Boundary Properties in Melt-Textured YBa2Cu3O7-x Superconductors", Texas Center for Superconductivity and Dept of Mechanical Engineering, University of Houston, 1992 Preprint, (assumed published in 1993).

Z. Lian et al, "The Properties of YBCO Superconductors Prepared by a New Approach: The 'Powder Melting Process'"., IOP Publishing Limited, 1990. (Publication Name Unknown).

*Primary Examiner*—Ngoclan T. Mai

*Attorney, Agent, or Firm*—Fredric L. Sinder; Thomas L. Kundert

[57] ABSTRACT

A new process for more easily making a superconducting matrix of $YBa_2Cu_3O_{7-x}$ with fine and homogeneously dispersed $Y_2BaCuO_5$ inclusions smaller than one micron compacts powders of $YBa_2Cu_3O_{7-x}$ and $Y_2BaCuO_5$ into samples which are first sintered for improved mechanical stability and then placed into contact with each other. The samples are placed into a furnace above the peritectic temperature of the $YBa_2Cu_3O_{7-x}$ and held at that temperature for less than about fifteen minutes so that the $YBa_2Cu_3O_{7-x}$ begins to melt and be absorbed by capillary action into the $Y_2BaCuO_5$ sample. The combined sample is cooled to a temperature below the peritectic temperature by a variety of alternative cooling cycles where it is transformed by a reaction into a superconducting matrix of $YBa_2Cu_3O_{7-x}$ with fine and homogeneously dispersed $Y_2BaCuO_5$. $BaCuO_2+CuO$ may be substituted for the $YBa_2Cu_3O_{7-x}$ and $Y_2O_3$ substituted for the $Y_2BaCuO_5$ as starting components.

9 Claims, No Drawings

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PROCESS FOR TRANSFORMING PURE $Y_2BACUO_5$ INTO A SUPERCONDUCTING MATRIX OF $YBA_2CU_3O_{7-x}$ WITH FINE AND HOMOGENEOUSLY DISPERSED $Y_2BACUO_5$ INCLUSIONS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to ceramic superconductors, and more particularly to a process for easily making a superconducting matrix of $YBa_2Cu_3O_{7-x}$ with fine and homogeneously dispersed $Y_2BaCuO_5$ inclusions.

As described in U.S. Pat. No. 5,084,436 to Morimoto et al., which is incorporated by reference, a rare earth oxide superconductor such as $YBa_2Cu_3O_{7-x}$ (also referred to as a 1-2-3 phase; both nomenclatures are used interchangeably in this description) has a predetermined direction in the crystals of the 1-2-3 phase in which an electric current readily flows. The current tends to hardly flow among crystals aligned in different directions. Further, the grain boundaries can act either as poor superconductors or as insulating layers. Because of this, none of the polycrystal rare earth superconductors exhibit a high critical current density.

As described in Morimoto et al., to obtain a material having a high critical current density, the prior art has attempted a variety of methods for preparing a crystal structure where crystals of the 1-2-3 phase are aligned and grain boundaries are suppressed. The conventional method has been to solidify a melt of ceramic material in one direction under a temperature gradient to obtain an aligned ceramic material having a density higher than that obtainable by a sintering method. Unfortunately, the 1-2-3 phase melts incongruently at its peritectic temperature (the temperature at which part of the material is in a solid phase and part in a liquid phase) of about 1015° C. to form $Y_2BaCuO_5$ crystals (also referred to as a 2-1-1 phase; both nomenclatures are used interchangeably in this description) and a liquid phase rich in barium and copper. Accordingly, when this melt is cooled, a dense 1-2-3 material is formed with 2-1-1 inclusions. These inclusions are large in size and inhomogeneously distributed, which prevents good current density.

Morimoto et al. reported that although the 2-1-1 crystal particle inclusions show no superconductivity, they do not hinder the flow of electric current and give no substantial adverse effects to the superconducting properties as long as they are independent from each other. It has been since discovered that fine, homogeneously distributed, 2-1-1 inclusions actually help the superconducting material get good flux-pinning which results in higher current densities.

The present state of the art for producing 1-2-3 material with fine 2-1-1 inclusions involves mixing 1-2-3 powders with 2-1-1 powders or platinum. The powders are heated to >1200° C. and splat-quenched. Splat-quenching is cooling by quickly squeezing the material between two copper plates. After splat-quenching, the material is ground into powders and pressed into pellets. The pellets then undergo melt-processing where they are heated to a temperature where a melt or liquid begins to form. This temperature will generally be slightly above the peritectic point. This temperature is held for a short period (about 12 minutes), after which the pellets are quickly cooled to just below the peritectic point and further cooled at a slow rate. After slow-cooling to about 925° C., the material is cooled to room temperature at about 240° /hour. Finally, the pellets undergo an oxygenation process for 24 hours at 450° C. Unfortunately, the whole process is very laborious, typically taking 4–5 days to complete.

Thus it is seen that there is a need for an easier method for making 1-2-3 material with fine and homogeneously dispersed 2-1-1 inclusions.

It is, therefore, a principal object of the present invention to provide a method for easily making a superconducting matrix of $YBa_2Cu_3O_{7-x}$ (1-2-3) with fine and homogeneously dispersed $Y_2BaCuO_5$ (2-1-1) inclusions. The fine and homogeneously dispersed 2-1-1 inclusions provide increased flux pinning for higher current densities.

It is a feature of the present invention that it avoids the splat-quench step of the prior art melt-processing procedure.

It is an advantage of the present invention that it can produce finely distributed 2-1-1 inclusions smaller than one micron.

It is another advantage of the present invention that it can be used to easily produce very large pieces of superconducting material, such as bars, with fine and homogeneous distribution of 2-1-1 inclusions. It can also be used to easily produce superconducting magnets, superconducting leads such as downleads for large magnets, superconducting generators, actuators and bearings.

These and other objects, features and advantages of the present invention will become apparent as the description of certain representative embodiments proceeds.

SUMMARY OF THE INVENTION

The present invention provides a process for easily making a superconducting matrix of $YBa_2Cu_3O_{7-x}$ with fine and homogeneously dispersed $Y_2BaCuO_5$ inclusions. The unique discovery of the present invention is that, first, a sample of $YBa_2Cu_3O_{7-x}$ touching a sample of $Y_2BaCuO_5$ will, when heated to above its peritectic temperature, melt and flow by capillary action into the $Y_2BaCuO_5$ sample and react to form the desired superconducting matrix of $YBa_2Cu_3O_{7-x}$ with fine and homogeneously dispersed $Y_2BaCuO_5$ inclusions and, second, that the temperature to which the samples are heated and the time duration they are held at that temperature during the capillary flow step are critical to successfully producing small inclusions under one micron.

Accordingly, the present invention is directed to a method for making a ceramic superconductor, comprising the steps of providing a supply of $Y_2BaCuO_5$, providing a supply of $YBa_2Cu_3O_{7-x}$, placing the two supplies in contact with each other, next placing the two supplies into a furnace at a temperature above the peritectic temperature of $YBa_2Cu_3O_{7-x}$ for a period of less than about fifteen minutes so that the supply of $YBa_2Cu_3O_{7-x}$ begins to melt and so that the resulting melt begins to be absorbed by capillary action into the supply of $Y_2BaCuO_5$, and next cooling the resulting material to a temperature lower than the peritectic temperature of $YBa_2Cu_3O_{7-x}$ and holding that temperature for a period of time to promote growth of $YBa_2Cu_3O_{7-x}$. The initial furnace temperature above the peritectic temperature may be about 1100° C. Cooling the resulting material after melting may comprise quickly cooling the resulting material to the peritectic temperature of $YBa_2Cu_3O_{7-x}$, then slowly cooling the resulting material to 960° C. and then holding that temperature for a period of about twenty-four hours. Cooling the resulting material after melting may also comprise quickly cooling the resulting material to about 960° C. and then holding that temperature for a period of about twenty-four hours. The starting density of the supply of $Y_2BaCuO_5$ may be in the range of 35–43% of its theoretical maximum density.

The present invention is also directed to substituting a supply of $BaCuO_2+CuO$ for the $YBa_2Cu_3O_{7-x}$ and the two supplies first heated up to just above the eutectic temperature of the $BaCuO_2+CuO$ and holding that temperature for a period of time sufficient for congruent melting of the $BaCuO_2+CuO$, and, second, heating the two supplies up to a temperature of just above the peritectic temperature of $YBa_2Cu_3O_{7-x}$ to ensure complete melting and so that the resulting melt begins to be absorbed by capillary action into the supply of $Y_2BaCuO_5$. The cooling step for this process may comprise quickly cooling the resulting material to the peritectic temperature of $YBa_2Cu_3O_{7-x}$, then slowly cooling the resulting material to 960° C. and then holding that temperature for a period of about twenty-four hours. The cooling step may also comprise quickly cooling the resulting material to about 960° C. and holding that temperature for a period of about twenty-four hours.

The present invention is further directed to substituting $Y_2O_3$ for the $Y_2BaCuO_5$.

The present invention is yet further directed to a method for making a ceramic superconductor, comprising the steps of providing a supply of $Y_2BaCuO_5$, mixing into the supply of $Y_2BaCuO_5$ an amount by weight of the combined supplies of 5 to 30 percent of $YBa_2Cu_3O_{7-x}$, next placing the combined supplies of $Y_2BaCuO_5$ and $YBa_2Cu_3O_{7-x}$ into a furnace at a temperature above the peritectic temperature of $YBa_2Cu_3O_{7-x}$ for a period of less than about fifteen minutes so that the supply of $YBa_2Cu_3O_{7-x}$ begins to melt and so that the resulting melt begins to be absorbed by capillary action throughout the $Y_2BaCuO_5$, and next cooling the resulting material to a temperature lower than the peritectic temperature of $YBa_2Cu_3O_{7-x}$ and holding that temperature for a period of time to promote growth of $YBa_2Cu_3O_{7-x}$. $BaCuO_2+CuO$ may be substituted for the $YBa_2Cu_3O_{7-x}$ and the two supplies, first, slowly heated to just above the eutectic temperature of the $BaCuO_2+CuO$ and then held at that temperature for a period of time sufficient for congruent melting of the $BaCuO_2+CuO$ and, second, the two supplied then heated up to a temperature of just above the peritectic temperature of $YBa_2Cu_3O_{7-x}$ to ensure complete melting and so that the resulting melt begins to be absorbed by capillary action into the supply of $Y_2BaCuO_5$.

The invention is still further directed to a method for making a ceramic superconductor, comprising the steps of providing a supply of $RE_2BaCuO_5$, wherein RE is defined as at least one member selected from the group consisting of Y, La, Nd, Sm, Eu, Gd, Dy, Ho, Er, Tm, Yb and Lu, providing a supply of $REBa_2Cu_3O_{7-x}$, placing the two supplies in contact with each other, next placing the two supplies into a furnace at a temperature above the peritectic temperature of the $REBa_2Cu_3O_{7-x}$ for a period of less than about fifteen minutes so that the supply of $REBa_2Cu_3O_{7-x}$ begins to melt and so that the resulting melt begins to be absorbed by capillary action into the supply of $RE_2BaCuO_5$, and next cooling the resulting material to a temperature lower than the peritectic temperature of $REBa_2Cu_3O_{7-x}$ and holding that temperatures for a period of time to promote growth of $REBa_2Cu_3O_{7-x}$. Cooling the resulting material after melting may comprise quickly cooling the resulting material to the peritectic temperature of $YBa_2Cu_3O_{7-x}$, then slowly cooling the resulting material to 960° C. and then holding that temperature for a period of about twenty-four hours. Cooling the resulting material after melting may also comprise quickly cooling the resulting material to about 960° C. and then holding that temperature for a period of about twenty-four hours.

DETAILED DESCRIPTION

Separate samples, or supplies, of 2-1-1 and 1-2-3 material are made by compacting powders of the materials into desired shapes, such as disks or bars. The samples are then sintered at 940° C. for 24 hours. This sintering step is not necessary, but results in a final material that better maintains its physical shape. After sintering, the 2-1-1 and 1-2-3 samples are placed together so that they touch, such as by placing the 1-2-3 sample on top of the 2-1-1 sample. The combined sample is then inserted inside a furnace or oven at about 1100° C., which is above the peritectic temperature (about 1015°) of 1-2-3, and held for about 12 minutes. It is critical that the holding period be no longer than about 15 minutes. The combined sample is then quickly cooled to 1015° C. (the peritectic temperature of 1-2-3) and then slowly cooled to 960° C., held for 24 or more hours, then allowed to cool to room temperature. The liquid that results from the 1-2-3 that melts above 1015° C. is primarily $BaCuO_2$ and CuO and flows by capillary action into the 2-1-1 sample. When the combined sample is cooled to a temperature below the peritectic temperature of the 1-2-3, the resulting liquid reacts with the 2-1-1 sample, transforming it into a superconducting 1-2-3 matrix with fine and homogeneously dispersed 2-1-1 inclusions according to the following reaction.

$$Y_2BaCuO_5+\text{liquid}(3BaCuO_2+2CuO)\rightarrow\alpha YBa_2Cu_3O_{7-x}+\beta Y_2BaCuO_5(\text{inclusions})$$

where $\alpha$ and $\beta$ values are dependent on the completeness of the reaction.

Two rates of cooling and final temperatures have worked well in practice. As described, in the first alternative cooling step, after a rapid drop (typically as fast as the furnace will allow, about 3 minutes for an 85° C. drop) to the peritectic temperature of the 1-2-3, the combined sample was slowly cooled (typically about 1° C./hour) to 960° C., held for about 24 or more hours to promote the growth of the 1-2-3 phase in the original 2-1-1 sample, and then allowed to cool to room temperature. In the second alternative cooling step, the combined sample was quickly cooled to 960° C. from 1100° C., then held for about 24 or more hours to promote the growth of the 1-2-3 phase in the original 2-1-1 sample, and then allowed to cool to room temperature.

The reason that it is critical that the holding period during which the two samples are heated above the peritectic temperature be no longer than about fifteen minutes is that longer times produce 2-1-1 inclusions 5 microns and larger in size. By limiting the temperature and time as described, resulting homogeneously distributed 2-1-1 inclusions smaller than one micron have been achieved.

The starting density of the 2-1-1 sample can be chosen to achieve a final preferred weight percent of 2-1-1 inside the 1-2-3 matrix of 20–30%. This range of final weight percentages achieves the best flux pinning and highest current densities. To achieve this final resulting range of weight percentages, the starting density of the 2-1-1 sample should be in the range of 35–43% of its theoretical maximum density. A more dense starting material provides a greater capillary force, but less volume for absorbing the liquid. A less dense starting material provides a greater volume for absorbing liquid, but a lower capillary force. The range of 35–43% will produce the best results.

Those with skill in the art of the invention will see that separate pieces of 1-2-3 and 2-1-1 material may not be required. For example, a small amount (5–30% by weight) of 1-2-3 material could be mixed with 2-1-1 material in powder form and there would still be a capillary flow of liquid into the 2-1-1 material and transformation of the 2-1-1 to 1-2-3.

Those will skill in the art of the invention will also see that smaller, experimental-size samples will quickly heat and quickly cool inside a furnace. Those with skill in the art will therefore see that the described temperatures may also be understood as applying to the internal temperatures of larger samples.

Those with skill in the art will further see that different elements, such as silver, can be added to the 2-1-1 sample at the beginning of the process to improve mechanical properties.

Those with skill in the art will still further see that a starting sample of 1-2-3 material is not necessarily needed. The starting sample could instead be composed of $BaCuO_2+CuO$. $BaCuO_2$ and CuO can be obtained in powdered form and pressed and sintered into pellets the same as $YBa_2Cu_3O_{7-x}$. The starting sample would need to be first heated (at about 200° C./hour) to just above the eutectic temperature of the $BaCuO_2+CuO$, about 920° C., for a period of time sufficient for congruent melting of the $BaCuO_2+CuO$, about 18 minutes, then heated at a rate of about 75° C./hour to just above the peritectic temperature of $YBa_2Cu_3O_{7-x}$, about 1035° C., held for 1 minute, followed by a cooling step of quickly cooling to 960° C., holding for 24 hours or more, and then allowing to cool to room temperature. An alternative cooling step would be to quickly drop from the 1035° C. temperature to 1015° C., then slowly cool to 960° C., hold that temperature for 24 or more hours, and then allow to cool to room temperature.

Similarly, the $Y_2BaCuO_5$ can be replaced with $Y_2O_3$ to absorb and react with the resulting liquid from the melted 1-2-3 (or melted $BaCuO_2$ and CuO) to form a new 1-2-3 matrix.

Those with skill in the art will yet further see that the disclosed method need not be limited to yttrium-based superconductors, but may be extended to include all rare earth oxide superconductors. In that case, the equations for the samples are written as $REBa_2Cu_3O_{7-x}$ and as $RE_2BaCuO_5$, where RE is defined as at least one member selected from the group consisting of Y, La, Nd, Sm, Eu, Gd, Dy, Ho, Er, Tm, Yb and Lu.

Those with skill in the art will recognize that the value of x in $O_{7-x}$ is very small. The value of the subscript for oxygen should preferably be exactly 7 to achieve a perfect stoichiometric ratio, but that is very difficult to achieve and those with skill in the art have long recognized the practice of using a value of 7−x to indicate a value preferably very close to 7. A "y", a delta (Δ) or a gamma (δ) is sometimes used in place of x. Occasionally, a solitary "y" is used for the amount of oxygen in place of "7−y".

The disclosed new method for making a superconducting matrix of $YBa_2Cu_3O_{7-x}$ with fine and homogeneously dispersed $Y_2BaCuO_5$ inclusions successfully demonstrates the value of using capillary absorption to achieve a good homogeneous distribution of one material in another, even where the material being absorbed is not the final material for which a good homogeneous distribution is desired but will, after further processing, become the matrix itself, and the value of precise control of the processing times and temperatures to achieve a final material having the best possible dimensions and other properties. Although the disclosed method is specialized, its teachings will find application in other areas where homogeneous distribution of one material into another is difficult to achieve.

It is understood that various modifications to the invention as described may be made, as might occur to one with skill in the field of the invention, within the scope of the claims. Therefore, all embodiments contemplated have not been shown in complete detail. Other embodiments may be developed without departing from the spirit of the invention or from the scope of the claims.

We claim:

1. A method for making a ceramic superconductor, comprising the steps of:

(a) providing a supply of $Y_2BaCuO_5$;

(b) providing a supply of $YBa_2Cu_3O_{7-x}$;

(c) placing the two supplies in contact with each other;

(d) next placing the two supplies into a furnace at a temperature above the peritectic temperature of $YBa_2Cu_3O_{7-x}$ for a period of less than about fifteen minutes so that the supply of $YBa_2Cu_3O_{7-x}$ begins to melt and so that the resulting melt begins to be absorbed by capillary action into the supply of $Y_2BaCuO_5$; and, (e) next cooling the resulting material to a temperature lower than the peritectic temperature of $YBa_2Cu_3O_{7-x}$ and holding that temperature for a period of time to promote growth of $YBa_2Cu_3O_{7-x}$.

2. The method for making a ceramic superconductor according to claim 1, wherein the temperature above the peritectic temperature in step (d) is about 1100° C.

3. The method for making a ceramic superconductor according to claim 1, wherein step (e) is characterized as next quickly cooling the resulting material to the peritectic temperature of $Y_2BaCuO_{7-x}$, then slowly cooling the resulting material to 960° C. and then holding that temperature for a period of about twenty-four hours.

4. The method for making ceramic superconductor according to claim 1, wherein step (e) comprises quickly cooling the resulting material to about 960° C. and then holding that temperature for a period of about twenty-four hours.

5. The method for making a ceramic superconductor according to claim 1, wherein the starting density of the supply of $Y_2BaCuO_5$ is in the range of 35–43% of its theoretical maximum density.

6. A method for making a ceramic superconductor, comprising the steps of:

(a) providing a supply of $Y_2BaCuO_5$;

(b) mixing into the supply of $Y_2BaCuO_5$ an amount by weight of the combined supplies of 5 to 30 percent of $YBa_2Cu_3O_{7-x}$;

(c) next placing the combined supplies of $Y_2BaCuO_5$ and $YBa_2Cu_3O_{7-x}$ into a furnace at a temperature above the peritectic temperature of $YBa_2Cu_3O_{7-x}$ for a period of less than about fifteen minutes so that the supply of $YBa_2Cu_3O_{7-x}$ begins to melt and so that the resulting melt begins to be absorbed by capillary action throughout the $Y_2BaCuO_5$; and, (e) next cooling the resulting material to a temperature lower than the peritectic temperature of $YBa_2Cu_3O_{7-x}$ and holding that temperature for a period of time to promote growth of $YBa_2Cu_3O_{7-x}$.

7. A method for making a ceramic superconductor, comprising the steps of:

(a) providing a supply of $RE_2BaCuO_5$, wherein RE is defined as at least one member selected from the group consisting of Y, La, Nd, Sm, Eu, Gd, Dy, Ho, Er, Tm, Yb and Lu;

(b) providing a supply of $REBa_2Cu_3O_{7-x}$;

(c) placing the two supplies in contact with each other;

(d) next placing the two supplies into a furnace at a temperature above the peritectic temperature of $REBa_2Cu_3O_{7-x}$ for a period of less than about fifteen minutes so that the supply of $REBa_2Cu_3O_{7-x}$ begins to melt and so that the resulting melt begins to be absorbed by capillary action into the supply of $RE_2BaCuO_5$; and, (e) next cooling the resulting material to a temperature lower than the peritectic temperature of the $REBa_2Cu_3O_{7-x}$ and holding that temperature for a period of time to promote growth of $REBa_2Cu_3O_{7-x}$.

8. The method for making a ceramic superconductor according to claim 7, wherein step (e) comprises next quickly cooling the resulting material to the peritectic temperature of $REBa_2Cu_3O_{7-x}$, then slowly cooling the resulting material to 960° C. and then holding that temperature for a period of about twenty-four hours.

9. The method for making a ceramic superconductor according to claim 7, wherein step (e) comprises quickly cooling the resulting material to about 960° C. and then holding that temperature for a period of about twenty-four hours.

* * * * *